(12) United States Patent
Brecht et al.

(10) Patent No.: US 11,639,968 B1
(45) Date of Patent: May 2, 2023

(54) BATTERY TESTING APPARATUS WITH INTEGRAL TEMPERATURE CONTROL

(71) Applicant: WILDCAT DISCOVERY TECHNOLOGIES, Inc., San Diego, CA (US)

(72) Inventors: David J. Brecht, San Diego, CA (US); Justin J. Dutton, San Diego, CA (US); Alec John Kochis, San Diego, CA (US)

(73) Assignee: WILDCAT DISCOVERY TECHNOLOGIES, Inc., San Diego, CA (US)

( * ) Notice: Subject to any disclaimer, the term of this patent is extended or adjusted under 35 U.S.C. 154(b) by 0 days.

(21) Appl. No.: 17/583,652

(22) Filed: Jan. 25, 2022

Related U.S. Application Data

(60) Provisional application No. 63/141,191, filed on Jan. 25, 2021.

(51) Int. Cl.
| | |
|---|---|
| *G01R 31/36* | (2020.01) |
| *G01K 7/22* | (2006.01) |
| *G01R 31/374* | (2019.01) |
| *G01R 31/3842* | (2019.01) |
| *G01R 31/396* | (2019.01) |

(52) U.S. Cl.
CPC .......... *G01R 31/3644* (2013.01); *G01K 7/22* (2013.01); *G01R 31/374* (2019.01); *G01R 31/3842* (2019.01); *G01R 31/396* (2019.01)

(58) Field of Classification Search
None
See application file for complete search history.

(56) References Cited

U.S. PATENT DOCUMENTS

| | | | |
|---|---|---|---|
| 2019/0273289 A1* | 9/2019 | Hahn | H01M 10/4285 |
| 2020/0064407 A1* | 2/2020 | Zhang | G01R 31/371 |
| 2021/0226472 A1* | 7/2021 | Lee | H01M 10/613 |

\* cited by examiner

*Primary Examiner* — Jas A Sanghera
(74) *Attorney, Agent, or Firm* — Quinn IP Law

(57) ABSTRACT

A battery testing apparatus includes a battery cycler configured to position a battery cell in a cell pocket defined by a baseplate. The apparatus additionally includes a thermal control device configured to regulate thermal energy in the cell pocket, a baseplate thermistor for detecting baseplate temperature, and thermal control device thermistor for detecting thermal control device temperature. The apparatus also includes a printed circuit board (PCB) in electric communication with the thermal control device thermistor. An electronic microcontroller, in electric communication with the baseplate thermistor and the PCB, is configured to regulate operation of the thermal control device based on data from the baseplate thermistor and the thermal control device thermistor. A main controller, in electronic communication with the microcontroller, is programmed to establish set values for baseplate temperature and battery cell reference current or voltage and regulate electrical input to the battery cell in accordance with the reference values.

24 Claims, 5 Drawing Sheets

BATTERY TESTING APPARATUS WITH INTEGRAL TEMPERATURE CONTROL

CROSS-REFERENCE TO RELATED APPLICATION(S)

This application claims the benefit of U.S. Provisional Application Ser. No. 63/141,191 filed Jan. 25, 2021, the entire content of which is hereby incorporated by reference.

INTRODUCTION

The present disclosure relates to an apparatus with integral temperature control for testing electro-chemical battery cells.

Electro-chemical battery cells may be broadly classified into primary and secondary batteries. Primary batteries, also referred to as disposable batteries, are intended to be used until depleted, after which they are simply replaced with new batteries. Secondary batteries, more commonly referred to as rechargeable batteries, employ specific chemistries permitting such batteries to be repeatedly recharged and reused, therefore offering economic, environmental and ease-of-use benefits compared to disposable batteries. Electro-chemical batteries may be used to power such diverse items as toys, consumer electronics, and motor vehicles.

An electro-chemical battery includes an anode, i.e., an electrode through which conventional electrical current enters the polarized battery, and a cathode, i.e an electrode through which conventional electrical current leaves the polarized battery. The anode and cathode electrodes are typically configured as wires or plates, where the anode is the electrode having excess positive charge. Conventional current flow is from cathode to anode via an electrical path external to the battery (with electrons moving in the opposite direction), regardless of the cell type and its operating mode. In secondary cells, cathode polarity with respect to the anode may be positive or negative depending on how the battery is being operated. The electrodes of an electro-chemical battery are typically immersed in an electrolyte that conducts ions as the battery charges or discharges.

Battery cells may be tested by varied application of electrical current or voltage to measure their response. In the case when the voltage is applied, the measured response is electrical current. On the other hand, when the current is applied, the measured response is voltage. Various other criteria may also be part of the testing protocol, such as vibration or variation in ambient temperature.

SUMMARY

A battery testing apparatus includes a battery cycler configured to position at least one battery cell. The battery cycler includes a baseplate defining at least one cell pocket, wherein each cell pocket is configured to accept one of the battery cells. The battery cycler also includes at least one thermal control device configured to regulate thermal energy in one respective cell pocket. The battery cycler additionally includes a baseplate thermistor configured to detect temperature of the baseplate. The battery cycler also includes at least one thermal control device thermistor. Each thermal control device thermistor is configured to detect temperature of one respective thermal control device. The battery cycler also includes at least one printed circuit board (PCB). Each PCB is in electric communication with at least one of the thermal control device thermistors.

The battery cycler additionally includes an electronic microcontroller in electric communication with the baseplate thermistor and with the at least one PCB, and configured to regulate operation of the thermal control device(s) in response to data from the baseplate thermistor and the respective thermal control device thermistor(s). The battery testing apparatus also includes an electronic main controller in communication with the microcontroller. The electronic main controller is programmed with an algorithm configured to establish set values for temperature of the baseplate and battery cell reference values for electrical current or voltage. The electronic main controller is further configured to regulate an electrical current or a voltage applied to at least one of the battery cells in accordance with the respective battery cell electrical current or voltage reference values.

The battery testing apparatus may also include at least one cell thermistor. Each cell thermistor may be configured to detect temperature of one respective battery cell. In such an embodiment, each PCB may be additionally in electric communication with at least one of the cell thermistors.

The battery testing apparatus may additionally include a climate chamber in electronic communication with the main controller and configured to house the battery cycler in a temperature-controlled environment.

The battery testing apparatus may have a modular construction permitting multiple battery cyclers to be stacked or otherwise organized in a compact arrangement, with each cycler simultaneously connected to and regulated by the main controller.

The battery testing apparatus may also include a cooling fan configured to generate an airflow across the baseplate to remove thermal energy from the baseplate. In such an embodiment, the electronic microcontroller may be additionally configured to regulate operation of the cooling fan in response to the data from the baseplate thermistor and the at least one thermal control device thermistor.

The battery testing apparatus may also include a housing configured to support the electronic microcontroller and the cooling fan in proximal relation with respect to the baseplate.

The battery testing apparatus may additionally include a top plate configured to engage the baseplate and cover the at least one cell pocket and the respective at least one battery cell therein. In such an embodiment, the top plate may include at least one electrically conductive plunger. Each electrically conductive plunger may be configured to contact one battery cell. Also, each PCB may be in electric communication with one or more thermal control device thermistors and one cell thermistor via respective individual electrically conductive plungers.

The battery testing apparatus may additionally include at least one data acquisition unit (DAU), wherein a plurality of DAUs may be interconnected via a control area network (CAN) bus. Each DAU may be in electronic communication with one PCB and configured to acquire, for the associated battery cell, current, voltage, and temperature data from the respective PCB.

The electronic microcontroller may be additionally configured to receive, from the at least one DAU, the current, voltage, and temperature data for the associated battery cell acquired from the respective PCB.

Each of the plurality of cell thermistors may be spring-loaded against a respective one battery cell.

The battery testing apparatus may also include at least one spring-loaded plunger. Each spring-loaded plunger may be configured to impart pressure to at least one battery cell.

Each cell thermistor may extend through a respective one spring-loaded plunger.

The thermal control device may include a heating element and/or a cooling element. Each of the heating and cooling elements may be arranged proximate to or in direct contact with the baseplate.

The battery testing apparatus may also include an ambient temperature sensor in electronic communication with the electronic main controller. The electronic main controller may be further configured to regulate operation of the at least one thermal control device and the at least one cooling fan, via the electronic microcontroller, in response to data received from the ambient temperature sensor.

The above features and advantages, and other features and advantages of the present disclosure, will be readily apparent from the following detailed description of the embodiment(s) and best mode(s) for carrying out the described disclosure when taken in connection with the accompanying drawings and appended claims.

DETAILED DESCRIPTION

Figure 1:
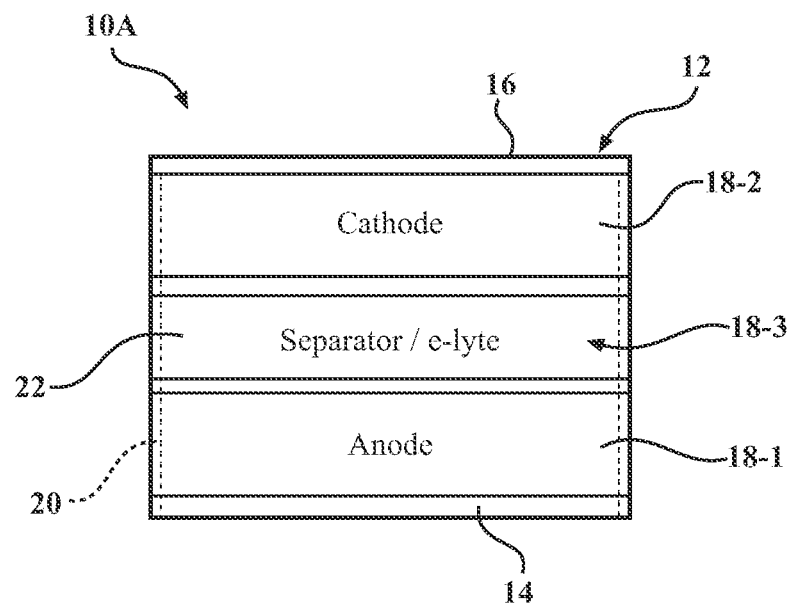
FIG. 1 is a schematic partially sectioned or cut-away side view of a coin battery cell having anode and cathode electrodes.
Figure 2:
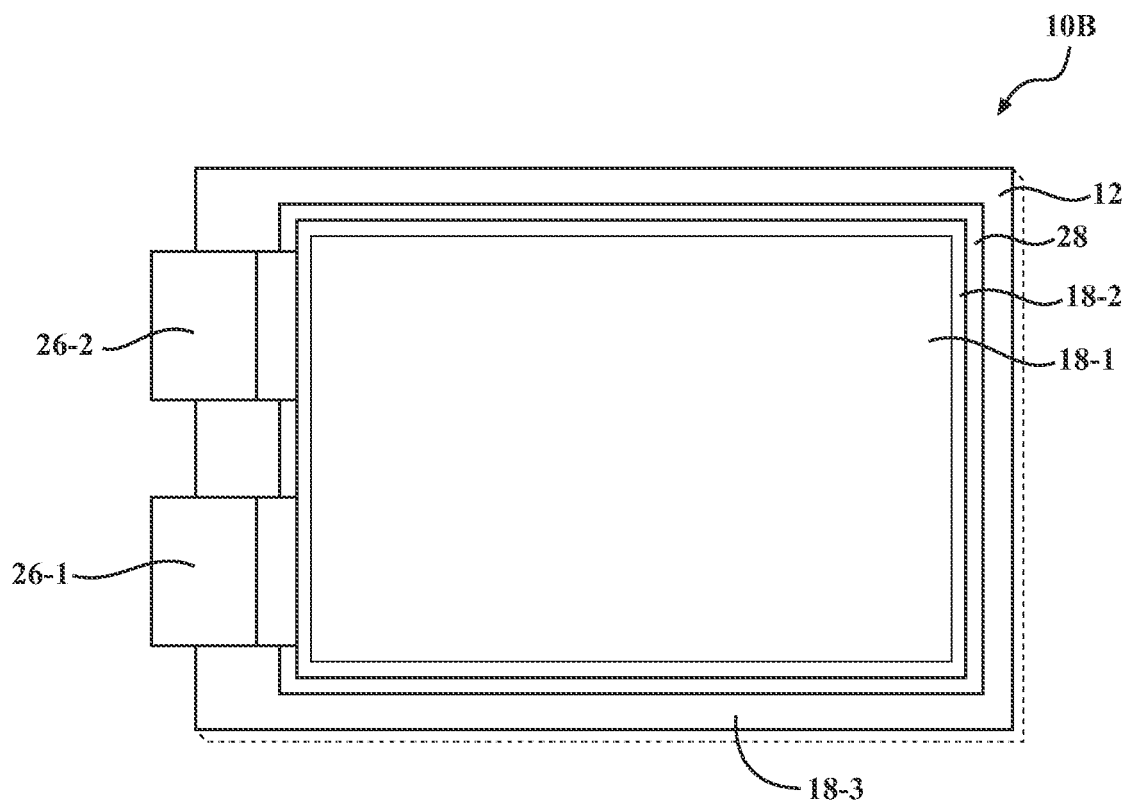
FIG. 2 is a schematic cut-away view of a pouch battery cell having anode and cathode electrodes.

Referring to FIGS. 1 and 2, two exemplary embodiments of a battery cell are depicted. FIG. 1 depicts a rigid cylindrically shaped or "button" or coin type of battery cell 10A, while FIG. 2 depicts a pouch type of battery cell 10B. Generally, battery cells 10 generate electrical energy through heat-producing electro-chemical reactions. Additionally, battery cells, such as the cells 10A, 10B may be configured either as primary, i.e., disposable, or secondary i.e., rechargeable, energy storage cells. As a primary energy cell, a battery cell may be configured, for example, as a Lithium, Nickel Cadmium, or Nickel Metal Hydride cell. As a secondary energy cell, a battery may be configured, for example, as a Lithium ion (Li-ion) cell. Battery cells, such as shown in FIGS. 1 and 2 may, for example, be employed for operating toys, consumer electronics, and motor vehicles. Multiple coin or pouch cells may be stacked together for enhanced performance in specific applications.

As noted, FIG. 1 depicts an exemplary embodiment of the coin battery cell 10A in a partially cut-away state to illustrate arrangement of the cell's internal components. As shown, an assembled coin battery cell 10A includes a sealable container or housing 12, configured as a hard metal case. The housing 12 is effectively constructed from an anode case 14 nestled within a cathode case 16. The anode case 14 is packaged within and is in contact with a negative electrode or anode 18-1, while the cathode case 16 is packaged within and is in contact with a positive electrode or cathode 18-2. The anode 18-1 may be a free-standing lithium metal anode or be deposited on a current collector. The cathode 18-2 may be similarly deposited on a current collector. The container 12 may be sealed by a polymer type gasket 20 and crimping or via an adhesive.

The anode case 14 is spaced apart from and is electrically insulated from the cathode case 16, such as via the gasket 20. The gasket 20 may, for example, be formed from polypropylene. The anode 18-1 may be physically isolated from the cathode 18-2 by a separator 22, thereby forming a layered structure, which may then be enclosed within the housing 12. Sealing of the container 12 is intended to keep volatile species within the coin battery cell 10A during charge/discharge cycling, and to prevent moisture from entering the cell, which is detrimental to the cell's performance. Such sealing methods may fail when subjected to repeated mechanical stresses, as the cell's dimensions change during cycling due to dimensional changes of the electrodes, gas generation within the cell, or thermal expansion/contraction during wide temperature swings. The anode 18-1 and the cathode 18-2 are immersed in an electrolyte 18-3 formulated to conduct ions as the battery cell 10 discharges, and also when the battery charges, as in the case of a rechargeable battery (such as in an exemplary case of a Lithium ion (Li-ion) rechargeable battery). In particular, the gasket 20 is generally fixed in place via crimping of the cathode case 16 around the anode case 14, to thereby encase and seal the anode 18-1, cathode 18-2, and electrolyte 18-3.

FIG. 2 depicts an exemplary embodiment of a pouch battery cell 10B in a cut-away state to illustrate the cell's construction and arrangement of its internal components. A pouch battery cell 10B generally operates like the coin cell 10A and includes a number of functionally analogous components. As shown, an assembled pouch battery cell 10B includes its respective housing 12, in the present embodiment specifically configured as a sealed flexible enclosure or pouch. Walls of the pouch are typically constructed from two layers of polymer sandwiching an aluminum layer. The pouch cell 10B includes the respective anode 18-1 and the respective cathode 18-2. The anode 18-1 is in contact with a negative terminal 26-1, while the cathode 18-2 is in contact with a positive terminal 26-2 As shown, the anode 18-1 is physically isolated from the cathode 18-2 by a separator 28. As in the coin cell 10A, the anode 18-1 and the cathode 18-2 of the pouch cell LOB are immersed in the electrolyte 18-3 and then packaged and sealed within the housing 12, i.e., the pouch.

In general, coin and pouch battery cells 10A, 10B are designed and assembled to maintain physical integrity and reliable performance under a variety of external and internal stresses, such as due to vibration and temperature fluctuations. However, current and voltage output of electro-chemical battery cells, such as 10A and 10B, is typically affected by ambient temperature variations, and it may be useful to quantify, under controlled conditions, the correlation between ambient temperature and battery cell performance. Traditionally, battery cells are tested in a climate-controlled chamber, where a number of cells are simultaneously subjected to variations in ambient temperatures.

Figure 3:
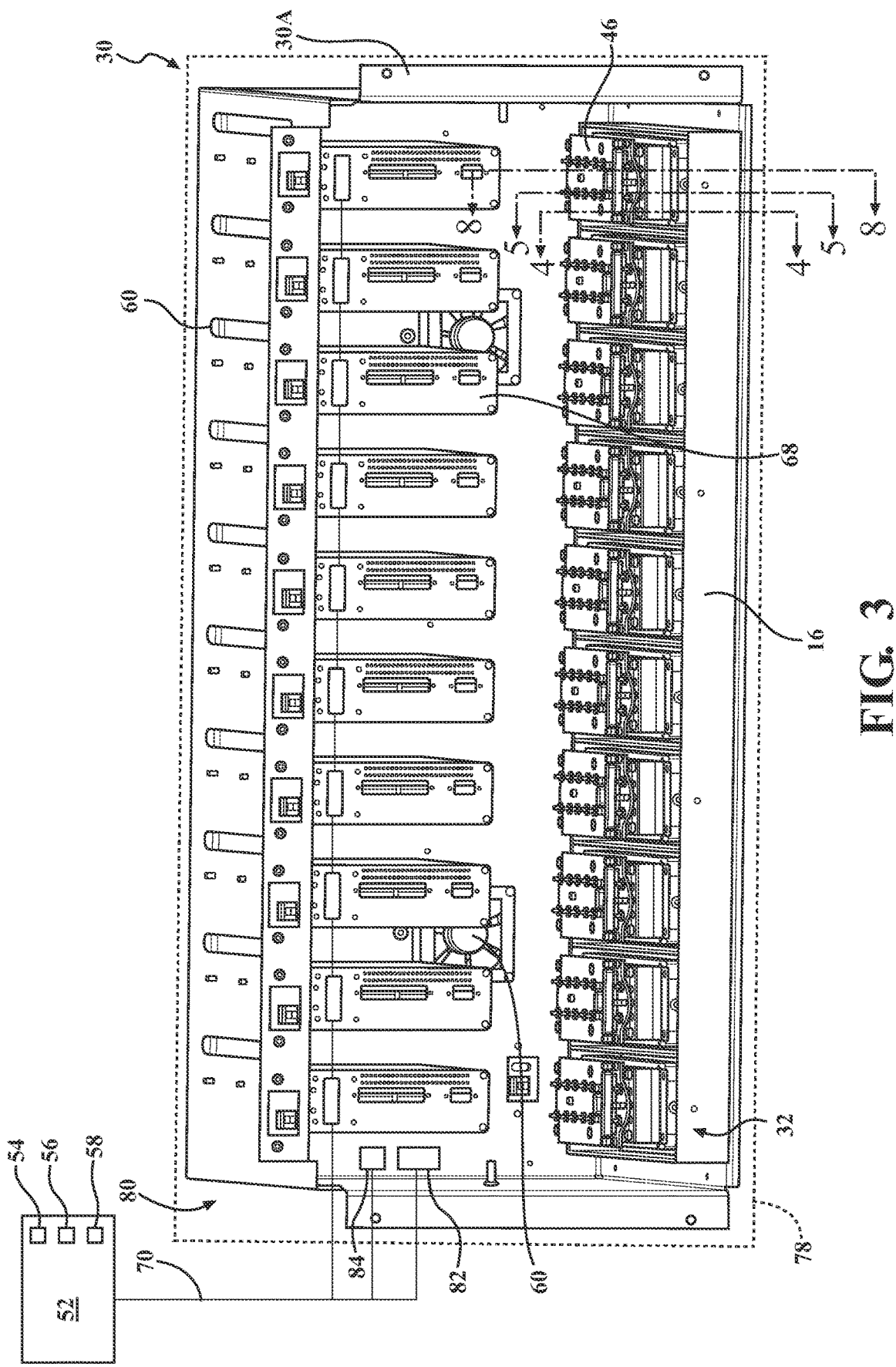
FIG. 3 is a schematic perspective view of a modular battery testing apparatus having a battery cycler for testing battery cells as shown in FIGS. 1 and 2, wherein the battery cycler is arranged inside a controller-regulated climate chamber, according to the present disclosure.

A modular battery testing apparatus 30 with integrated or internal temperature control is shown in FIG. 3. The modular testing apparatus 30 is configured to regulate an input parameter, such as voltage or electrical current, to at least one battery cell 10A or 10B, and assess the subject battery cells' response, such as current or voltage, under controlled variation in testing temperature. The modular testing apparatus 30 includes one or more concurrently regulated battery cyclers 32, each configured to accept and position thereon one or more battery cells 10A or 10B. Although 10 battery cyclers 32 are illustrated in FIG. 3, fewer or greater number of battery cyclers 32 may be employed. In a cross-sectional plane 4-4 indicated in FIG. 3 and shown in FIG. 4, each battery cycler 32 includes a baseplate 34 defining a plurality of battery cell pockets 36, but a battery cycler having one individual battery cell pocket configured to accommodate a single battery cell 10A or 10B is also envisioned.

Each cell pocket 36 is configured to accept one of the battery cells 10A or 10B. Each battery cycler 32 also includes at least one thermal control device 38. Each thermal control device 38 may, for example, include a thermoelectric heating element 38A configured to supply thermal energy to at least one of the respective cell pockets 36. The heating element(s) 38A may be energized via DC power, such as produced by a power supply 39. In an embodiment where the heating element is a singular component, the subject heating element may be configured as a heater tray (shown in FIGS. 4 and 5) having a heating pad attached thereto and arranged in direct contact with or in close proximity to the baseplate 34. Alternatively, the battery cycler 32 may include a plurality of individual heating elements 38A (not shown), wherein each heating element is arranged in close proximity to one respective pocket 36 and configured to impart thermal energy thereto. In such an embodiment, each individual heating element is electrically connected to the power supply 39. Each thermal control device 38 may also include one or more cooling elements 38B, such as a liquid refrigerant circulating conductive cooler or cooling plate operating as a heat sink, configured to remove thermal energy from at least one of the respective cell pockets 36 and the baseplate 34 in general. Such cooling element(s) 38B may be connected to an external fluid supply (not shown) and arranged in direct contact with or in close proximity to the baseplate 34. In the case of multiple cooling elements 38B, each cooling element may be positioned next to one or a number of respective pockets 36 for cooling thereof. Furthermore, the thermal control device 38 may include a combination of the heating and cooling elements 38A, 38B, selectively configured to control the temperature of the baseplate 34.

Figure 4:
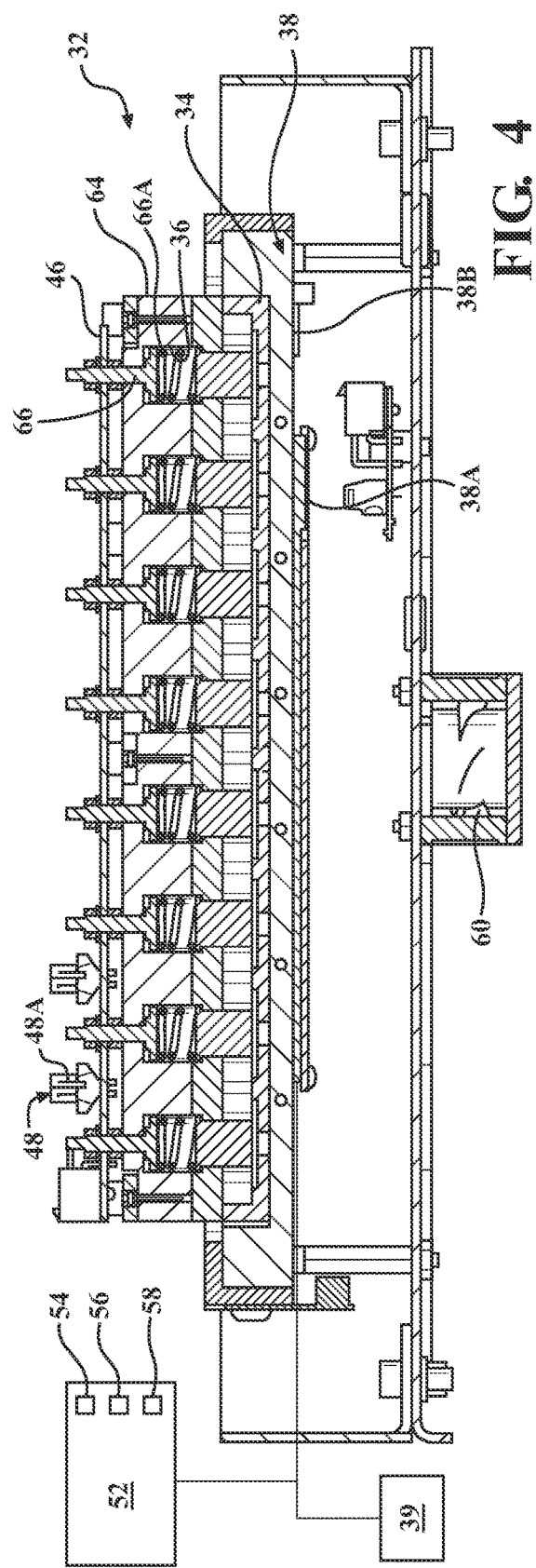
FIG. 4 is a schematic cross-sectional side view of a particular section of the battery cycler indicated in FIG. 3, and showing a baseplate defining a plurality of battery cell pockets, according to the present disclosure.
Figure 5:
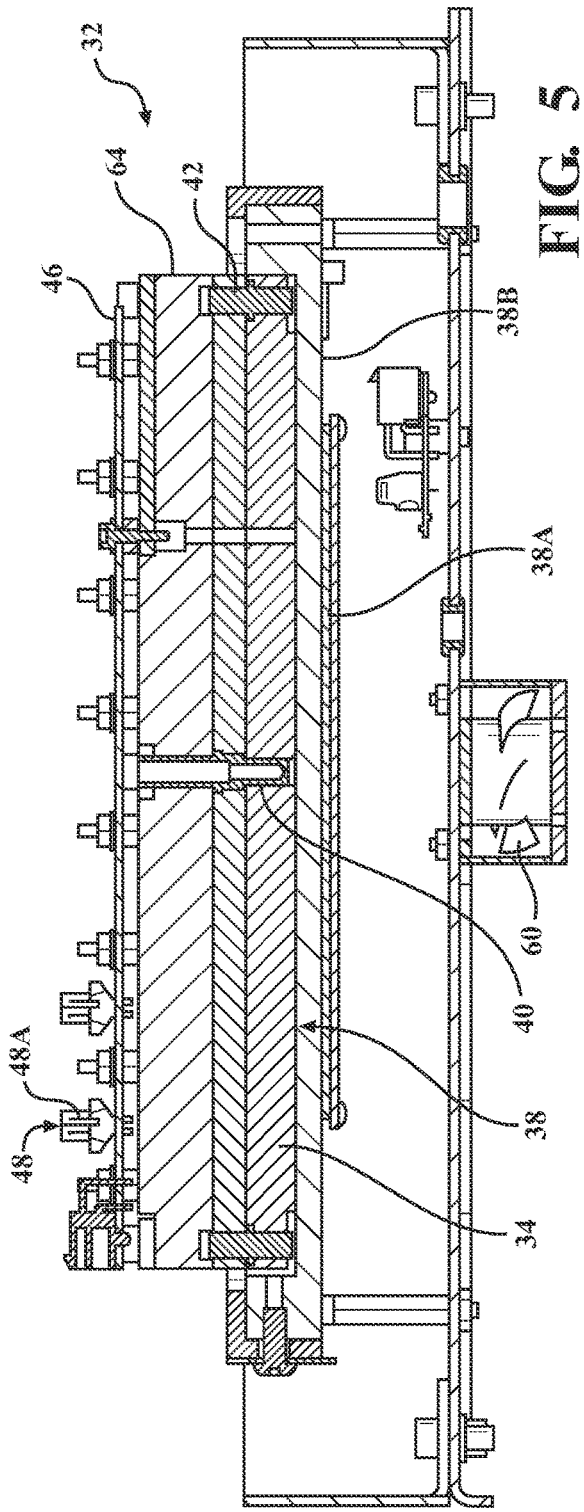
FIG. 5 is a schematic cross-sectional side view of a particular section of the battery cycler indicated in FIG. 3, and showing a baseplate thermistor configured to detect temperature of the baseplate, according to the present disclosure.
Figure 8:
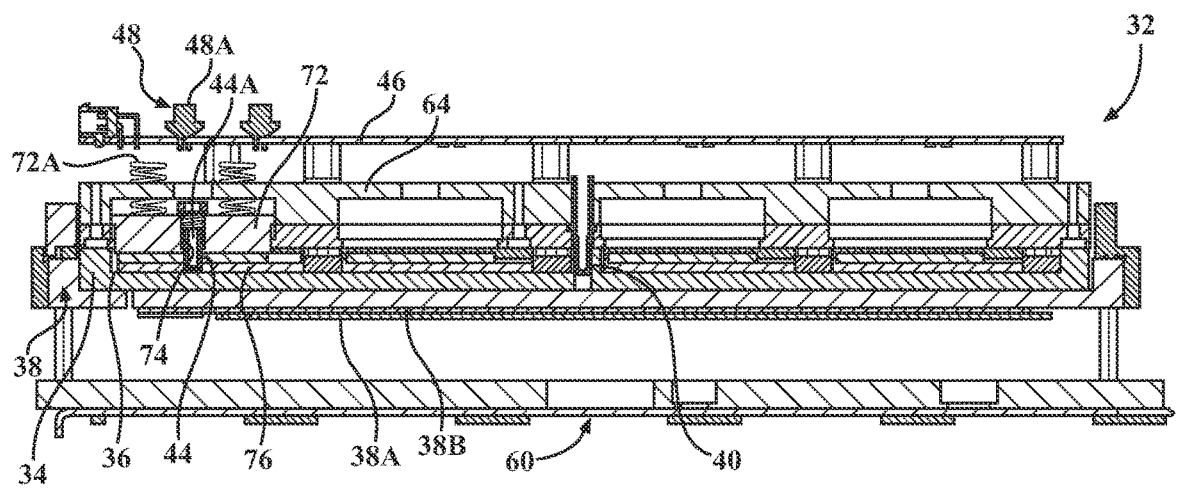
FIG. 8 is a schematic cross-sectional side view of a particular section of the battery cycler indicated in FIG. 3 and showing spring-loaded plungers and the cell thermistor being spring-loaded against a battery cell within its baseplate pocket, according to the present disclosure.

As shown in a cross-sectional plane 5-5 indicated in FIG. 3 and shown in FIG. 5, each battery cycler 32 additionally includes a baseplate thermistor 40 configured to detect temperature of the baseplate 34. The battery cycler 32 also includes one or more thermal control device thermistors 42. Each thermal control device thermistor 42 is configured to detect temperature of the respective thermal control device 38, irrespective of whether the testing apparatus 30 is cycling coin battery cells 10A or pouch battery cells 10B. As shown in FIG. 8, each battery cycler 32 may additionally include one or more cell thermistors 44. Each cell thermistor 44 is configured to detect temperature of the container 12 of the respective coin cell 10A or skin temperature of the respective pouch battery cell 10B. As shown in FIGS. 3-5, the battery cycler 32 further includes one or more printed circuit boards (PCBs) 46. Each PCB 46 is electrically connected, i.e., in electric communication, with one respective thermal control device thermistor 42 and may also be connected with each cell thermistor 44. Each PCB 46 includes an electric connector 48 (shown in FIGS. 4 and 5) having a plurality of contact pin(s) 48A, with one of the contact pins connected to a single thermal control device thermistor 42 for carrying temperature signal therefrom.

Figure 7:
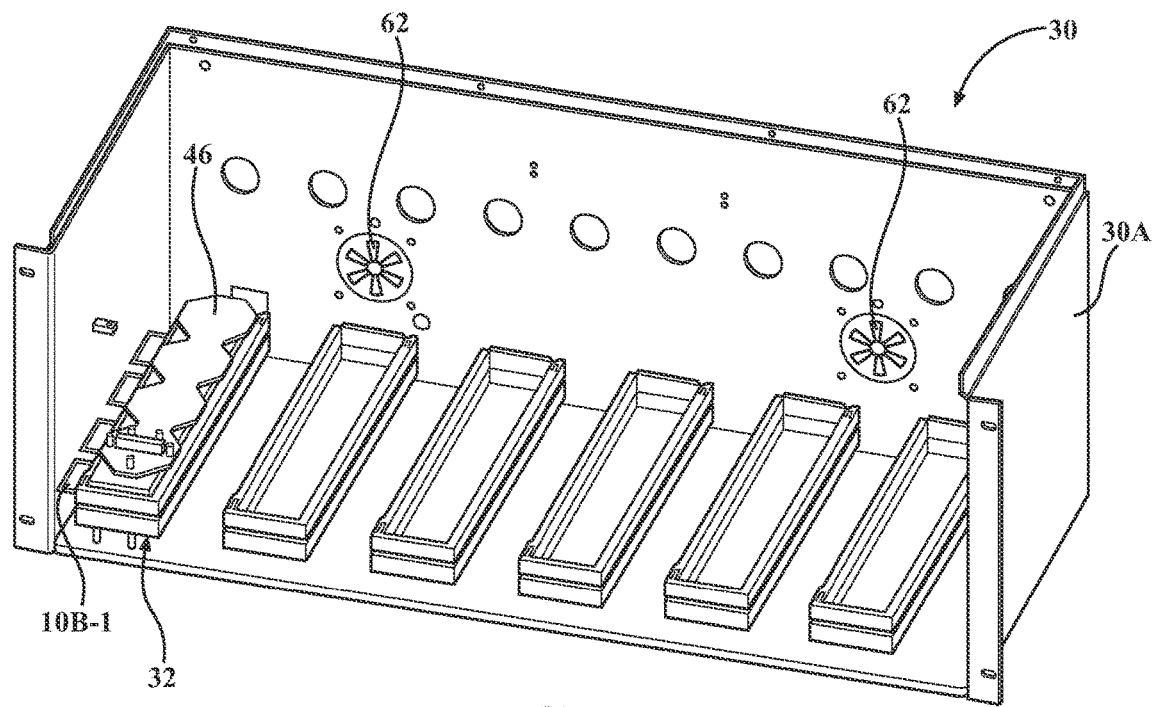
FIG. 7 is a schematic perspective view of multiple battery cyclers arranged side by side within the battery testing apparatus housing having module fans for circulating air, according to the present disclosure.

As shown in FIG. 3, the modular testing apparatus 30 includes a module frame or housing 30A configured to support the above-described components. Each housing 30A may include individual positions for multiple battery cyclers 32 and provide sufficient space between adjacent cyclers for placement and removal of individual battery cells 10A or 10B, as well as additional space for gas pockets or chimneys 10B-1 (shown in FIG. 7) that capture gases developed in the cycled pouch cells 10B. Multiple battery cyclers 32 may be arranged side by side and mounted to each individual housing 30A, as shown in FIGS. 3 and 7. Furthermore, groups of battery cyclers 32 arranged on individual housings 30A may be interconnected with other housings 30A, e.g., fastened to one another (not shown). In other words, multiple housings 30A may be combined, such as stacked or otherwise positioned and connected in a modular arrangement, to thereby achieve a desired scale of the modular battery testing apparatus 30.

Figure 6:
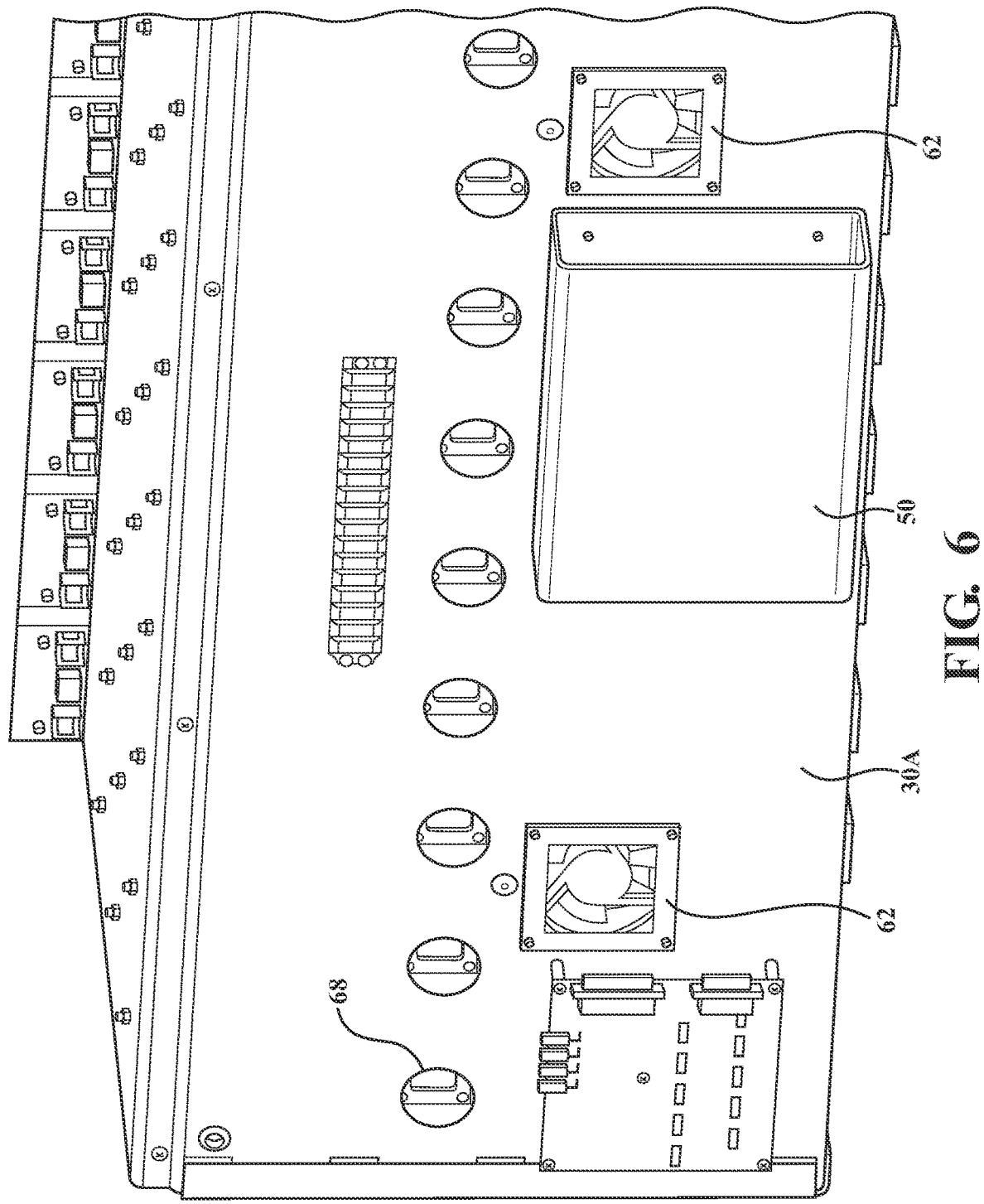
FIG. 6 is a schematic perspective view of an electronic microcontroller mounted to a battery testing apparatus housing, according to the present disclosure.

As shown in FIG. 6, each battery cycler 32 in the modular testing apparatus 30 includes an electronic microcontroller 50. The electronic microcontroller 50 is in electric communication with the baseplate thermistor 40 and with the PCB(s) 46 (via engagement with electric connectors 48) to gather temperature data from the baseplate thermistor and the thermal control device thermistors 42. The electronic microcontroller 50 is configured to regulate operation of the thermal control device(s) 38 in response to data from the baseplate thermistor 40 and the thermal control device thermistor(s) 42. As shown, the electronic microcontroller 50 may be mounted to the housing 30A, and thus service each of the battery cyclers 32 arranged on the particular housing.

With resumed reference to FIGS. 3 and 4, the modular testing apparatus 30 further includes an electronic main controller 52 in electronic communication with the electronic microcontroller(s) 50. The main controller 52 is programmed with a battery manager algorithm 54 configured to establish set temperature values 56 for the baseplate 34 and battery cell common or reference values 58 for input current or voltage. The main controller 52 is also configured, i.e., constructed and programmed, to regulate, in accordance with the established reference values 58, an electrical current or voltage applied to the battery cell(s) 10A or 10B being cycled by the modular testing apparatus 30. The main controller 52 includes a processor and tangible, non-transitory memory, which includes instructions for operation of the battery cycler 32 programmed therein. The memory may be an appropriate recordable medium that participates in providing computer-readable data or process instructions. Such a recordable medium may take many forms, including but not limited to non-volatile media and volatile media.

Non-volatile media for the main controller 52 may include, for example, optical or magnetic disks and other persistent memory. Volatile media may include, for example, dynamic random access memory (DRAM), which may constitute a main memory. Such instructions may be transmitted by one or more transmission medium, including coaxial cables, copper wire and fiber optics, including the wires that comprise a system bus coupled to a processor of a computer, or via a wireless connection. Memory of the main controller 52 may also include a flexible disk, hard disk, magnetic tape, another magnetic medium, a CD-ROM, DVD, another optical medium, etc. The electronic controller 58 may be configured or equipped with other required computer hardware, such as a high-speed clock, requisite Analog-to-Digital (A/D) and/or Digital-to-Analog (D/A) circuitry, input/output circuitry and devices (I/O), as well as appropriate signal conditioning and/or buffer circuitry. Algorithms required by the main controller 52 or accessible thereby may be stored in the memory and automatically executed to regulate the battery cycler(s) 32 included in the modular battery testing apparatus 30 via interaction with the respective electronic microcontroller(s) 50.

Each battery cycler 32 may include one or more cooling fans 60 (shown in FIGS. 4 and 5) configured to generate an airflow across the respective baseplate 34 and remove heat energy generated by the cycling of battery cells 10A or 10B. As shown, the cooling fan(s) 60 are mounted to the housing 30A in proximal relation with respect to the baseplate 34. The microcontroller 50 may be additionally configured to regulate operation of the cooling fan(s) 60 and/or the thermal control device 38 (including the heating and cooling elements 38A, 38B) in response to the data from the baseplate thermistor 40 and the at least one thermal control device thermistor 42. The modular testing apparatus 30 may also include module fans 62 (shown in FIGS. 6 and 7) configured to circulate air within the housing 30A and across PCB(s) 46 to remove heat therefrom. As shown, the module fan(s) 62 may be strategically positioned on the housing 30A to circulate ambient air across the battery cycler(s) 32. The battery manager algorithm 54 of the main controller 52 may be programmed to regulate operation of the module fan(s) 62.

The battery testing apparatus 30 may additionally include a top plate 64 (shown at least in FIG. 4) configured to engage the baseplate 34, overlay and cover the one or more cell pockets 36 and the respective battery cell(s) 10A or 10B therein. The top plate 64 may include one or more spring-loaded electrically conductive plungers 66, such as via individual springs 66A to ensure uninterrupted contact with the respective battery cell(s) 10A or 10B. As shown, each of the PCBs 46 may be mounted to the top plate 64. Additionally, each of the PCBs 46 may be in electric communication with the thermal control device thermistor(s) 42 and the cell thermistor(s) 44 via respective individual electrically conductive plunger(s) 66. Specifically, each PCB 46 may be in electric communication with one of the plungers 66, such that each plunger communicates a respective battery cell's 10A or 10B voltage and current to individual pins 48A of the associated electric connector 48 via "four-point measurement". Generally, four-point measurement is a practice used to nullify error in voltage measurement due to current flowing through the same connection point or pin. In four-point measurement, the voltage is measured at the same location that supplies current to the battery, but on a separate pin.

As shown in FIGS. 3 and 6, the battery testing apparatus 30 may additionally include one or more data acquisition units (DAUs) 68, wherein a plurality of DAU's is interconnected via a control area network (CAN) bus 70. Each DAU 68 may be in electronic communication with one PCB 46, such as hard-wired to the respective electrical connectors 48. The respective DAUs 68 are configured to acquire current, voltage, and temperature data from the respective PCBs 46 for the respective battery cells 10A or 10B arranged within individual cell pockets 36. The microcontroller 50 may be additionally configured to receive, from each of the DAUs 68, the battery cell current, voltage, and temperature data acquired from the respective PCBs 46.

As shown in a cross-sectional plane 8-8 indicated in FIG. 3 and shown in FIG. 8, each of the cell thermistors 44 may be spring-loaded, such as via individual springs 44A against a respective one of the battery cells 10A or 10B situated within the individual pockets 36. Furthermore, the battery testing apparatus 30 may include a plurality of spring-loaded plungers 72, such as via individual springs 72A. Each such spring-loaded plunger 72 may be configured to impart pressure to at least one of the battery cells 10A or 10B to fix each particular battery within its respective pocket 36. As also shown in FIG. 8, each of the plurality of cell thermistors 44 may extend through a respective one of the plurality of spring-loaded plungers 72, such as through a passage 74 defined by each respective plunger. Each pocket 36 may include layers or pads 76 of foam or another type of thermally and chemically stable material on each side of the battery cell 10A or 10B arranged therein to support the respective battery cell.

As discussed above, along with set temperature, the controlled input in the battery cycler 32 may be either electrical current or voltage. Accordingly, response of the respective battery cell(s) 10A, 10B may be conversely measured as either voltage or current. Multiple battery cyclers 32 may be combined and connected in a modular arrangement to thereby achieve a desired scale of the battery testing apparatus 30. The battery cyclers 32 combined in such an arrangement may be regulated concurrently by the main controller 52 via an appropriately configured battery manager algorithm 54. The modular testing apparatus 30 is intended to employ its integrated temperature control to concurrently regulate individual battery cyclers 32 via the main controller 52 in lieu of the subject cycler being tested in a common climate-controlled chamber. Accordingly, the disclosed modular testing apparatus 30 enables more precise control over ambient temperature of individual battery cells and permits multiple cells to be tested simultaneously, but at independently controlled conditions.

Furthermore, the battery testing apparatus 30 may additionally include a climate chamber 78 capable of generating an enclosed controlled environment 80. The climate chamber 78 is configured to house the battery cycler(s) 32 in a temperature-regulated, as well as humidity-controlled ambient environment 80. Such a controlled ambient environment 80 permits operating the battery cycler(s) 32 at cold (freezing) or hot temperatures and allow rapid cooling/heating of the respective battery cell(s) 10A, 10B. The climate chamber 78 may therefore include heating and cooling elements 82, such as respective self-contained resistive heaters and refrigeration units, or be connected to an external supply of liquid nitrogen or carbon dioxide. The climate chamber 78 may also include one or more temperature sensors 84 configured to detect ambient temperature of the enclosed environment 80. The temperature sensor(s) 84 are in electronic (wired or wireless) communication with the main controller 52.

The main controller 52 may additionally include algorithm(s) configured to regulate the heating and cooling elements 82 in response to programmed or set temperature values and signals received from the temperature sensor(s)

84. Such algorithm(s) may then be used to actively regulate the environment 80 inside the climate chamber 78 to influence ambient testing temperature of the battery cells 10A, 10B inside the battery cycler(s) 32. The electronic main controller 52 may be further configured to regulate operation of the thermal control device(s) 38 and the cooling fan(s) 60, via the electronic microcontroller 50, in response to data from the temperature sensor(s) 84.

The detailed description and the drawings or figures are supportive and descriptive of the disclosure, but the scope of the disclosure is defined solely by the claims. While some of the best modes and other embodiments for carrying out the claimed disclosure have been described in detail, various alternative designs and embodiments exist for practicing the disclosure defined in the appended claims. Furthermore, the embodiments shown in the drawings or the characteristics of various embodiments mentioned in the present description are not necessarily to be understood as embodiments independent of each other. Rather, it is possible that each of the characteristics described in one of the examples of an embodiment may be combined with one or a plurality of other desired characteristics from other embodiments, resulting in other embodiments not described in words or by reference to the drawings. Accordingly, such other embodiments fall within the framework of the scope of the appended claims.

What is claimed is:

1. A battery testing apparatus comprising:
   a battery cycler configured to position a battery cell and including:
      a baseplate defining a cell pocket configured to accept one battery cell;
      a thermal control device configured to regulate thermal energy in the cell pocket;
      a baseplate thermistor configured to detect temperature of the baseplate;
      a thermal control device thermistor configured to detect temperature of the thermal control device;
      a printed circuit board (PCB) in electric communication with the thermal control device thermistor; and
      an electronic microcontroller in electric communication with the baseplate thermistor and with the PCB and configured to regulate operation of the thermal control device in response to data from the baseplate thermistor and the thermal control device thermistor; and
   an electronic main controller in communication with the electronic microcontroller, programmed with an algorithm configured to establish set values for temperature of the baseplate and battery cell reference electrical current or voltage values and configured to regulate an electrical current or a voltage applied to the battery cell in accordance with the respective battery cell electrical current or voltage reference values.

2. The battery testing apparatus of claim 1, further comprising a cell thermistor configured to detect temperature of the battery cell, and wherein the PCB is additionally in electric communication with the cell thermistor.

3. The battery testing apparatus of claim 2, further comprising a spring-loaded plunger configured to impart pressure to the battery cell.

4. The battery testing apparatus of claim 3, wherein the cell thermistor extends through the spring-loaded plunger.

5. The battery testing apparatus of claim 2, wherein the cell thermistor is spring-loaded against the battery cell.

6. The battery testing apparatus of claim 2, further comprising a top plate configured to engage the baseplate, cover the cell pocket and the battery cell therein, wherein:
   the top plate includes an electrically conductive plunger configured to contact the battery cell; and
   the PCB is in electric communication with the thermal control device thermistor and the cell thermistor via respective individual electrically conductive plungers.

7. The battery testing apparatus of claim 1, further comprising a climate chamber in operative communication with the main controller and configured to house the battery cycler in a temperature-controlled environment, wherein the electronic main controller is additionally configured to regulate the environment inside the climate chamber.

8. The battery testing apparatus of claim 1, further comprising a data acquisition unit (DAU) in electronic communication with the PCB and configured to acquire, for the associated battery cell, current, voltage, and temperature data from the PCB.

9. The battery testing apparatus of claim 8, wherein the electronic microcontroller is additionally configured to receive, from the DAU, the current, voltage, and temperature data acquired from the PCB.

10. The battery testing apparatus of claim 1, further comprising a cooling fan configured to generate an airflow across the baseplate, and wherein the electronic microcontroller is additionally configured to regulate operation of the cooling fan in response to the data from the baseplate thermistor and the thermal control device thermistor.

11. The battery testing apparatus of claim 10, further comprising an ambient temperature sensor in electronic communication with the electronic main controller, wherein the electronic main controller is further configured to regulate operation of the thermal control device and the cooling fan, via the electronic microcontroller, in response to data from the ambient temperature sensor.

12. The battery testing apparatus of claim 10, further comprising a housing configured to support the electronic microcontroller and the cooling fan in proximal relation with respect to the baseplate.

13. The battery testing apparatus of claim 1, wherein the thermal control device includes at least one of a heating element and a cooling element, each arranged proximate to or in direct contact with the baseplate.

14. A battery testing apparatus comprising:
   a battery cycler configured to position a plurality of battery cells and including:
      a baseplate defining a plurality of cell pockets, wherein each cell pocket is configured to accept one of the plurality of battery cells;
      at least one thermal control device configured to regulate thermal energy in the plurality of cell pockets;
      a baseplate thermistor configured to detect temperature of the baseplate;
      at least one thermal control device thermistor, each configured to detect temperature of the respective at least one thermal control device;
      at least one cooling fan configured to generate an airflow across the baseplate;
      a plurality of printed circuit boards (PCBs), each PCB in electric communication with the at least one thermal control device thermistor; and
      an electronic microcontroller in electric communication with the baseplate thermistor and with the plurality of PCBs, and configured to regulate operation of the at least one thermal control device and the at least one cooling fan in response to data from the baseplate thermistor and the at least one thermal control device thermistor;

an electronic main controller in communication with the electronic microcontroller, programmed with an algorithm configured to establish set values for temperature of the baseplate and battery cell electrical current or voltage reference values, and configured to regulate an electrical current or a voltage applied to the plurality of battery cells in accordance with the respective battery cell electrical current or voltage reference values; and a climate chamber in operative communication with the electronic main controller and housing the battery cycler in a temperature-controlled environment, wherein the main controller is additionally configured to regulate the environment inside the climate chamber.

15. The battery testing apparatus of claim 14, further comprising a housing configured to support the electronic microcontroller and the cooling fan in proximal relation with respect to the baseplate.

16. The battery testing apparatus of claim 14, further comprising a plurality of cell thermistors, each configured to detect temperature of one of the plurality of battery cells, and wherein each PCB is in electric communication with the plurality of cell thermistors.

17. The battery testing apparatus of claim 16, further comprising a plurality of spring-loaded plungers, each spring-loaded plunger configured to impart pressure to at least one of the plurality of battery cells.

18. The battery testing apparatus of claim 17, wherein each of the plurality of cell thermistors extends through a respective one of the plurality of spring-loaded plungers.

19. The battery testing apparatus of claim 16, wherein each of the plurality of cell thermistors is spring-loaded against a respective one of the plurality of battery cells.

20. The battery testing apparatus of claim 16, further comprising a top plate configured to engage the baseplate, cover the plurality of cell pockets and the respective battery cells therein, wherein:

the top plate includes a plurality of electrically conductive plungers, each electrically conductive plunger being configured to contact a respective one of the plurality of battery cells; and each of the plurality of PCBs is in electric communication with the at least one thermal control device thermistor and the plurality of cell thermistors via respective individual electrically conductive plungers.

21. The battery testing apparatus of claim 14, further comprising a plurality of data acquisition units (DAUs) interconnected via a control area network (CAN) bus, each DAU in electronic communication with one of the plurality of PCBs and configured to acquire, for the plurality of battery cells, current, voltage, and temperature data from the respective PCB.

22. The battery testing apparatus of claim 21, wherein the electronic microcontroller is additionally configured to receive, from the plurality of DAUs, the current, voltage, and temperature data acquired from the respective PCBs.

23. The battery testing apparatus of claim 14, wherein the at least one thermal control device includes at least one of a heating element and a cooling element, each arranged proximate to or in direct contact with the baseplate.

24. The battery testing apparatus of claim 14, further comprising an ambient temperature sensor in electronic communication with the electronic main controller and configured to detect temperature of the environment inside the climate chamber, wherein the electronic main controller is further configured to regulate operation of the at least one thermal control device and the cooling fan, via the electronic microcontroller, in response to data from the ambient temperature sensor.

* * * * *